United States Patent
Zhou et al.

(10) Patent No.: US 10,287,498 B2
(45) Date of Patent: May 14, 2019

(54) LUMINESCENT COMPLEX, LUMINESCENT MATERIAL, SUBSTRATE FOR DISPLAY AND PRODUCTION METHOD THEREOF, AND DISPLAY APPARATUS

(71) Applicant: BOE TECHNOLOGY GROUP CO., LTD., Beijing (CN)

(72) Inventors: Tingting Zhou, Beijing (CN); Bin Zhang, Beijing (CN); Yonglian Qi, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/311,718

(22) PCT Filed: Dec. 22, 2015

(86) PCT No.: PCT/CN2015/098245
§ 371 (c)(1),
(2) Date: Nov. 16, 2016

(87) PCT Pub. No.: WO2017/008442
PCT Pub. Date: Jan. 19, 2017

(65) Prior Publication Data
US 2017/0183567 A1   Jun. 29, 2017

(30) Foreign Application Priority Data
Jul. 13, 2015   (CN) .......................... 2015 1 0409707

(51) Int. Cl.
*C09K 11/88* (2006.01)
*H01L 27/32* (2006.01)
(Continued)

(52) U.S. Cl.
CPC .......... *C09K 11/883* (2013.01); *C09K 11/025* (2013.01); *G02F 1/133516* (2013.01);
(Continued)

(58) Field of Classification Search
CPC ...... B82Y 40/00; G03F 7/0002; G03F 7/0037
See application file for complete search history.

(56) References Cited

U.S. PATENT DOCUMENTS

2006/0228635 A1* 10/2006 Suleski .................. B82Y 10/00
                                                        430/5
2007/0090755 A1*  4/2007 Eida ....................... B82Y 20/00
                                                        313/506
(Continued)

FOREIGN PATENT DOCUMENTS

CN           1655057 A    8/2005
CN         102002365 A    4/2011
(Continued)

OTHER PUBLICATIONS

Second Chinese Office Action, for Chinese Patent Application No. 201510409707.2, dated Apr. 1, 2017, 18 pages.
(Continued)

*Primary Examiner* — Alexandre F Ferre
(74) *Attorney, Agent, or Firm* — Kinney & Lange, P.A.

(57) ABSTRACT

The embodiments of this disclosure provide a luminescent complex, a luminescent material, a substrate for display and a production method thereof, and a display apparatus. This disclosure relates to the technical field of display. It is possible to increase the dispersibility of the luminescent particles, such as quantum dots or the like in the main material of a color filter to solve problems, such as uneven light emission, low light emission efficiency or the like of a substrate for display comprising the luminescent particles, so as to further reduce the loss of the back light brightness. This luminescent complex comprises a luminescent particle; an organic ligand attached to the surface of the luminescent particle; group A in the structural formula of the organic ligand is a binding group which binds to the luminescent particle; and in the structural formula of the organic ligand, the carbon-carbon double bond which is attached to the $X_1$ group, the $X_2$ group and the $X_3$ group may be subjected to a crosslinking reaction with a photosensitive resin under an exposure condition. This disclosure further provides a lumi-
(Continued)

nescent material which is used for the luminescent complex and comprises the luminescent complex, a substrate for display comprising this luminescent material, and a production method of a display apparatus.

11 Claims, 5 Drawing Sheets

(51) Int. Cl.

| | | |
|---|---|---|
| C09K 11/02 | (2006.01) | |
| G02F 1/1335 | (2006.01) | |
| G03F 7/00 | (2006.01) | |
| G03F 7/004 | (2006.01) | |
| G03F 7/027 | (2006.01) | |
| G03F 7/105 | (2006.01) | |
| G03F 7/20 | (2006.01) | |
| B82Y 20/00 | (2011.01) | |
| B82Y 40/00 | (2011.01) | |
| B82Y 30/00 | (2011.01) | |

(52) U.S. Cl.
CPC ...... *G02F 1/133617* (2013.01); *G03F 7/0007* (2013.01); *G03F 7/0047* (2013.01); *G03F 7/027* (2013.01); *G03F 7/105* (2013.01); *G03F 7/2053* (2013.01); *H01L 27/322* (2013.01); *B82Y 20/00* (2013.01); *B82Y 30/00* (2013.01); *B82Y 40/00* (2013.01); *G02F 1/133514* (2013.01); *G02F 1/133621* (2013.01); *G02F 2001/133614* (2013.01); *G02F 2202/36* (2013.01); *H01L 2251/5369* (2013.01); *Y10S 977/774* (2013.01); *Y10S 977/824* (2013.01); *Y10S 977/892* (2013.01); *Y10S 977/896* (2013.01); *Y10S 977/95* (2013.01)

(56) References Cited

U.S. PATENT DOCUMENTS

| | | | | |
|---|---|---|---|---|
| 2008/0272347 A1* | 11/2008 | Fukuda | ............... | C07F 9/5304 |
| | | | | 252/586 |
| 2009/0073349 A1* | 3/2009 | Park | ............... | B82Y 10/00 |
| | | | | 349/69 |
| 2009/0185059 A1* | 7/2009 | Kim | ............... | G03F 7/0007 |
| | | | | 348/273 |
| 2009/0283743 A1 | 11/2009 | Coe-Sullivan et al. | | |
| 2011/0213046 A1 | 9/2011 | Choi | | |
| 2012/0135141 A1 | 5/2012 | Ying et al. | | |

FOREIGN PATENT DOCUMENTS

| | | |
|---|---|---|
| CN | 102177095 A | 9/2011 |
| CN | 102675565 A | 9/2012 |
| CN | 102741297 A | 10/2012 |
| CN | 103728837 A | 4/2014 |
| CN | 104017574 A | 9/2014 |
| CN | 105062462 A | 11/2015 |
| EP | 1526584 A2 | 4/2005 |
| WO | 2005021150 A2 | 3/2005 |
| WO | 2008033388 A2 | 3/2008 |

OTHER PUBLICATIONS

International Search Report and Written Opinion (including English translation of Box V) for corresponding PCT Application No. CPT/CN2015/098245, dated Apr. 19, 2016.
First Chinese Office Action dated Sep. 9, 2016, for corresponding Chinese Application No. 201510409707.2.
Nikoderm Tomczak et al., "Designer polymer-quantum dot architectures", Progress in Polymer Science 34 (2009), pp. 393-430.
Nancy Joumaa et al., "Synthesis of Quantum Dot-Tagged Submicrometer Polystyrene Particles by Miniemulsion Polymerization", Langmuir 2006, 22, pp. 1810-1816.
Qiangbin Wang and Dong-Kyun Seo, "Preparation of photostable quantum dot-polystyrene microbeads through covalent organosilane coupling of CdSe@Zns quantum dots", J Mater Sci, (2009), 44, pp. 816-820.
Redouane Krini et al., "Photosensitive Functionalized Surface-Modified Quantum Dots for Polymeric Structures via Two-Photon-Initiated Polymerization Technique", Macromolecular Journals, 2015, 36, pp. 1108-1114.
Chinese Rejection Decision, for Chinese Patent Application No. 201510409707.2, dated Oct. 17, 2017, 15 pages.
Extended European Search Report, for European Patent Application No. 15892055.3, dated Jun. 26, 2018, 9 pages.

* cited by examiner

Fig. 1

Structural formula 1

Structural formula 2

Structural formula 3

Structural formula 4

Fig. 2

Structural formula 5

Structural formula 6

Structural formula 7

Structural formula 8

LUMINESCENT COMPLEX, LUMINESCENT MATERIAL, SUBSTRATE FOR DISPLAY AND PRODUCTION METHOD THEREOF, AND DISPLAY APPARATUS

FIELD OF THE INVENTION

This disclosure relates to the technical field of display, and particularly to a luminescent complex, a luminescent material, a substrate for display and a production method thereof, and a display apparatus.

BACKGROUND OF THE INVENTION

A liquid crystal display panel is mainly composed of a color filter substrate and an array substrate which are cell-assembled and a liquid crystal layer therebetween. Here, red, green, and blue color filters in an array arrangement are provided on the color filter substrate to achieve color display.

In the process that the back light emitted from a back light module is transmitted through red, green, and blue dye molecules in red, green, and blue color filters so as to display red light, green light, and blue light, since brightness loss will occur after the light passes through red, green, and blue dye molecules in color filters (typically, 70% of the brightness of the back light will be lost) such that the utilization of the back light is relatively low, a manner of further increasing the energy consumption of the back light is required to weaken the impact of color filters on the brightness loss of the back light.

It is one of the manners for solving brightness loss of back light in the prior art to replace the dye molecules in red, green, and blue color filters with photoluminescent particles binding normal organic ligands, such as quantum dots (simply referred to as QDs), i.e., forming a quantum dot color filter film. The loss of the back light brightness due to the color filter is reduced by the light emission principle that electrons on the valence band of luminescent particles, such as quantum dots, etc., under the light irradiation of back light are excited by the energy of photons to transit to the conduction band and energy is released in the form of photons when electrons on the conduction band transit back to the valence band so as to excite corresponding emissions of red light, green light, and blue light. Also, the light emission of quantum dots has a good color purity and a high color gamut.

However, since the size of luminescent particles, such as quantum dots, etc., is very minute and the three dimensions thereof are typically 100 nanometers (nm) or less, the agglomeration phenomenon of luminescent particles in the main material (such as resin, etc.) of the color filter will easily occur, resulting in the problem of uneven light emission of the quantum dot color filter film. Furthermore, since the photoluminescent property of luminescent particles depends on its minute size, after agglomeration of luminescent particles in the main material of the color filter occurs, the photoluminescent performance thereof will be greatly reduced, and electrons on the valence band of the luminescent particles under the light irradiation of back light transit to the conduction band. However, electrons on the conduction band do not transit back to the valence band, but fall in a trap level, and energy is quenched in a non-radiative form, leading to reduced light emission efficiency.

SUMMARY OF THE INVENTION

In view of this, in order to solve the problem in the prior art, the embodiments of this disclosure provide a luminescent complex, a luminescent material, a substrate for display and a production method thereof, and a display apparatus. It is possible to increase the dispersibility of luminescent particles, such as quantum dots, etc., in the main material of a color filter to solve problems, such as uneven light emission, low light emission efficiency, etc., of a substrate for display comprising the luminescent particles, so as to further reduce the loss of the back light brightness.

To achieve the object described above, the embodiments of this disclosure employ the following technical solutions:

In a first aspect, an embodiment of this disclosure provides a luminescent complex, which comprises:

a luminescent particle;

an organic ligand located on the surface of the luminescent particle;

the organic ligand has a structural formula of wherein group A is a binding group which binds to the luminescent particle;

$X_1$ group, $X_2$ group, and $X_3$ group each independently represent a hydrogen atom, an aryl group having a carbon atom number of 6-30, a halogen atom, —$CH_3$, —$(CH_2)_a$—$CH_3$, —COOH, —$COOCH_3$, or —CH=$CH_2$, wherein a is an integer greater than or equal to 1, wherein preferably, the aryl group having a carbon atom number of 6-30 is a phenyl group, and a is an integer greater than or equal to 1 and less than or equal to 30;

E group represents a hydrogen atom, a halogen atom, a hydroxyl group, a carboxyl group, a mercapto group, an amino group, a formyl group, —$SO_2NH_2$, —$NHNH_2$, a saturated carbon chain having a carbon atom number of 1-30, or an unsaturated carbon chain having a carbon atom number of 1-10;

D group represents a hydrogen atom, a halogen atom, a hydroxyl group, a carboxyl group, a mercapto group, an amino group, a formyl group, —$SO_2NH_2$, —$NHNH_2$, a saturated carbon chain having a carbon atom number of 1-30, or an unsaturated carbon chain having a carbon atom number of 1-10;

G group represents —$CH_2$—, —C=C—, —C≡C—, —COO—, —CONH—, —CO—, —O—, —OCONH, —NH—, —S—, —COS—, —CH=N—, —NHCONH—, —NHCSNH—, —NHNH—, or a bivalent cyclic group formed by removing one hydrogen atom respectively from two ring-forming carbon atoms in a benzene ring, cyclohexane, cyclopentane, thiophene, pyridine, pyrrole, imidazole, aniline, furan or carbazole;

wherein m is an integer and 0≤m≤30; n is an integer and 0≤n≤30; s is an integer and 0≤s≤30; (m+n+s)≠0; and p is an integer and 1≤p·(m+n+s)≤30, and in the structural formula of the organic ligand, the carbon-carbon double bond which is attached to the $X_1$ group, the $X_2$ group and the $X_3$ group may be subjected to a crosslinking reaction with a photosensitive resin under an exposure condition.

Preferably, the luminescent particle is a quantum dot.

Further preferably, the quantum dot comprises at least one compound selected from CdS, CdSe, CdTe, ZnS, ZnSe, ZnTe, HgS, HgTe, GaN, GaAs, InP, and InAs; and the A group represents any one of NC—, HOOC—, HRN—, O=P(R)$_2$—, POOOH—, RS—, and RSS—, and the R group represents any one of a hydrogen atom, a saturated carbon chain having a carbon atom number of 1-10, and an unsaturated carbon chain having a carbon atom number of 1-10.

Further preferably, if the quantum dot comprises two or more of the above compounds, the structure of the quantum dot is at least one of a core-shell type, a uniformly mixed type, and a gradiently mixed type.

Preferably, based on those described above, the organic ligand has at least one structural formula of:

In a second aspect, an embodiment of this disclosure further provides a luminescent material, which comprises a photosensitive resin; the luminescent material further comprises the luminescent complex described above dispersed in the photosensitive resin; wherein in the structural formula of the organic ligand in the luminescent complex, the carbon-carbon double bond which is attached to the $X_1$ group, the $X_2$ group and the $X_3$ group may be subjected to a crosslinking reaction with the photosensitive resin under an exposure condition.

Preferably, the photosensitive resin comprises a negative photoresist material.

Preferably, the mass proportion of the luminescent complex incorporated into the photosensitive resin is less than or equal to 50% based on the mass of the photosensitive resin.

Further preferably, the mass proportion is 3-20%.

In a third aspect, an embodiment of this disclosure further provides a substrate for display, which comprises a base substrate; the substrate for display further comprises color filter units of various colors located on the base substrate in an array arrangement; wherein at least a color filter unit of one color comprises a luminescent material cured by exposure, and the luminescent material is the luminescent material described above; and in the color filter unit of one color comprising the luminescent material cured by exposure, the luminescent particles in the luminescent material generate red light, green light, or blue light after being excited by light irradiation.

An embodiment of this disclosure further provides a production method of the substrate for display described above, which comprises the steps of:

coating a luminescent material on a base substrate; and sequentially performing first heating, exposure, development, and second heating on the luminescent material to form at least a color filter unit of one color.

In a fourth aspect, an embodiment of this disclosure further provides a display apparatus, which comprises the substrate for display described above.

As one optional manner, the display apparatus further comprises a back light module; the back light module provides light irradiation to the substrate for display.

Preferably, the light irradiation is blue light irradiation.

As another optional manner, the substrate for display is a color filter substrate; the display apparatus further comprises an organic electroluminescent display panel corresponding to the color filter substrate; wherein the organic electroluminescent display panel provides white light or blue light for the color filter substrate.

On this basis, with respect to the above luminescent complex provided in an embodiment of this disclosure, since the luminescent particle binds to the organic ligand, in the structural formula of the organic ligand, the carbon-carbon double bond which is attached to the $X_1$ group, the $X_2$ group and the $X_3$ group may be subjected to a crosslinking reaction with a photosensitive resin which is the main material of a color filter under an exposure condition, this allows the luminescent particles to be uniformly incorporated into the polymer system of the photosensitive resin, the effect of uniform dispersion, to which physical dispersion such as stirring, etc., is incomparable, can be achieved by the luminescent particles in the photosensitive resin. The occurrence of re-agglomeration of luminescent particles is also prevented in subsequent processing steps such as the second heating, etc., or in the process of use. Therefore, the dispersibility of luminescent particles, such as quantum dots, etc., in the main material of a color filter is increased to ameliorate problems, such as uneven light emission, low light emission efficiency, etc., of a substrate for display comprising luminescent particles due to the presence of agglomeration of luminescent particles, so as to further reduce the loss of the back light brightness caused by the color filter film.

BRIEF DESCRIPTION OF THE DRAWINGS

In order to illustrate the technical solutions in the embodiments of this disclosure or in the prior art more clearly, figures required for describing the embodiments or the prior art will be simply introduced below. It is apparent that the figures described below are merely some embodiments of this disclosure, and other figures may be further obtained by ordinary skilled person in the art according to these figures without exerting inventive work.

REFERENCE NUMERALS

01—luminescent complex; 10—luminescent particle; 10a—luminescent core; 10b—semiconductor shell; 11—organic ligand; 11a—main chain part of organic ligand; 11b—a functional group having a carbon-carbon double bond; 02—substrate for display; 20—base substrate; 21—color filter unit; 22—black matrix.

DETAILED DESCRIPTION OF THE INVENTION

The technical solutions in the embodiments of this disclosure will be described clearly and fully below in conjunction with accompanying drawings in the embodiments of this disclosure. Obviously, the embodiments described herein are merely part of the embodiments of this disclosure, rather than all of the embodiments. Based on the embodiments in this disclosure, all other embodiments obtained by those of ordinary skill in the art without performing inventive work belong to the scope protected by this disclosure.

It is to be noted that unless otherwise defined, all terms (including technical and scientific terms) used in the embodiments of this disclosure have the same meaning as commonly understood by one of ordinary skill in the art to which this disclosure belongs. It is also to be understood that those terms typically defined in dictionaries should be construed to have the meanings consistent with their meanings in the context of the related art and should not be construed with idealized or extremely formalized sense, unless explicitly defined in this way herein.

Furthermore, since the dimensions of the structures involved in the embodiments of this disclosure are in the order of magnitudes of millimeter (mm), micrometer (μm), sub-micrometer (100 nm-1.0 m), and nanometer (nm), for the purpose of clarity, the dimensions of the structures in figures of the embodiments of this disclosure are all magnified and do not represent the actual dimensions and ratios.

Moreover, the person skilled in the art should also understand that the structures illustrated in all figures of this disclosure do not form limitations of specific structure and composition of the luminescent complex 01 and/or the luminescent material XX below provided by the embodiments of this disclosure. Only the structures related to the inventive point are embodied for the purpose of clear description of this disclosure, and other structures which are not related to the inventive point are existing structures and are not embodied or are partly embodied in the figures.

Figure 1:
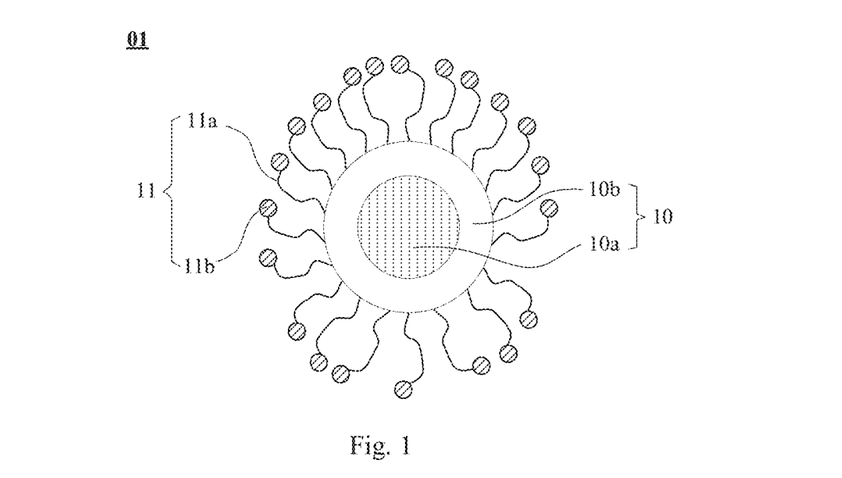
FIG. 1 is a structural schematic diagram of a luminescent complex provided in an embodiment of this disclosure.

An embodiment of this disclosure provides a luminescent complex 01, and this luminescent complex 01 comprises:

a luminescent particle 10; an organic ligand 11 located on the surface of the luminescent particle; the organic ligand 11 has a structural formula of:

wherein group A is a binding group which binds to the luminescent particle 10; $X_1$ group, $X_2$ group, and $X_3$ group each independently represent a hydrogen atom, an aryl group having a carbon atom number of 6-30, a halogen atom, —$CH_3$, —$(CH_2)_a$—$CH_3$, —COOH, —$COOCH_3$, or —CH═$CH_2$, wherein a is an integer greater than or equal to 1, wherein preferably, the aryl group having a carbon atom number of 6-30 is a phenyl group, and a is an integer greater than or equal to 1 and less than or equal to 30;

E group represents a hydrogen atom, a halogen atom, a hydroxyl group, a carboxyl group, a mercapto group, an amino group, a formyl group, —$SO_2NH_2$, —$NHNH_2$, a saturated carbon chain having a carbon atom number of 1-30, or an unsaturated carbon chain having a carbon atom number of 1-10;

D group represents a hydrogen atom, a halogen atom, a hydroxyl group, a carboxyl group, a mercapto group, an amino group, a formyl group, —$SO_2NH_2$, —$NHNH_2$, a saturated carbon chain having a carbon atom number of 1-30, or an unsaturated carbon chain having a carbon atom number of 1-10;

G group represents —$CH_2$—, —C═C—, —C≡C—, —COO—, —CONH—, —CO—, —O—, —OCONH, —NH—, —S—, —COS—, —CH═N—, —NHCONH—, —NHCSNH—, —NHNH—, or a bivalent cyclic group formed by removing one hydrogen atom respectively from two ring-forming carbon atoms in a benzene ring, cyclohexane, cyclopentane, thiophene, pyridine, pyrrole, imidazole, aniline, furan or carbazole;

wherein m is an integer and 0≤m≤30; n is an integer and 0≤n≤30; s is an integer and 0≤s≤30; (m+n+s)≠0; and p is an integer and 1≤p·(m+n+s)≤30, and in the structural formula of the organic ligand 11, the carbon-carbon double bond which is attached to $X_1$ group, $X_2$ group, and $X_3$ group may be subjected to a crosslinking reaction with a photosensitive resin under an exposure condition.

Those to be indicated are as follows. First, the luminescent particle 10 described above refers to a minute particle which emits light having a specific wavelength when being irradiated, and for example it may be a quantum dot.

Here, in order to allow the organic ligand 11 and the luminescent particle 10 to be bound together so as to be dispersed in a photosensitive resin, which is used as materials of red, green, and blue color filters in a color filter substrate, the structural formula of the organic ligand 11 has a binding group A, which may bind to the luminescent particle 10.

Here, the type of A group depends on the specific material composition of the luminescent particle 10, and the action force for binding them may be an action force of chemical bond or an intermolecular force (such as an action force of hydrogen bond), etc.

Considering that the quantum dot has three dimensions which are all 100 nm or less, has an appearance which looks like an extremely small dot-like substance, and the movement of electrons therein is limited in all directions, the quantum confinement effect is particularly significant. Furthermore, the quantum dot, as a new semiconductor nanomaterial, has a number of unique nanoscale properties, and particularly has good luminescent properties in the field of photoluminescence.

Therefore, as shown in FIG. 1, it is preferred in the embodiment of this disclosure that the luminescent particle 10 described above is a quantum dot. If the quantum dot comprises at least one compound of CdS, CdSe, CdTe, ZnS, ZnSe, ZnTe, HgS, HgTe, GaN, GaAs, InP, and InAs, then the A group represents any one of NC—, HOOC—, HRN—, O=P(R)$_2$—, POOOH—, RS—, and RSS—, and the R group represents any one of a hydrogen atom, a saturated carbon chain having a carbon atom number of 1-10, and an unsaturated carbon chain having a carbon atom number of 1-10.

Further, if the quantum dot (i.e., the luminescent particle 10 described above) comprises two or more of the compounds (i.e., CdS, etc.), the structure of the quantum dot is at least one of a core-shell type, a uniformly mixed type, and a gradiently mixed type.

Here, with reference to those shown in FIG. 1, considering that the quantum dot having a core-shell type structure is composed of a luminescent core 10a and a semiconductor shell 10b coating the luminescent core 10a, the light emission efficiency of the quantum dot is allowed to be further increased and the structural stability thereof is increased by means of this shell layer coating. Therefore, it is further preferred in the embodiment of this disclosure that the structure of the quantum dot is core-shell type.

Exemplarily, for example, a semiconductor material having a wide band gap such as CdS, ZnS may be used as the semiconductor shell 10b coating the luminescent core 10a. Accordingly, a semiconductor material such as CdSe, etc., may be used as the luminescent core 10a; and specific types of materials of the luminescent core 10a and the semiconductor shell 10b may be selected from the structures of quantum dots in the prior art, and are not specifically defined.

Second, in the structural formula of the organic ligand 11 described above, the carbon-carbon double bond at the end of the chain structure is attached to $X_1$ group, $X_2$ group, and $X_3$ group. Here, these three groups are independent of each other, and each group may represent any one of a hydrogen atom, an aryl group, a halogen atom, —CH$_3$, —(CH$_2$)$_a$— CH$_3$, —COOH, —COOCH$_3$, and —CH=CH$_2$, wherein a is an integer greater than or equal to 1, and wherein preferably, the aryl group having a carbon atom number of 6-30 is a phenyl group, and a is an integer greater than or equal to 1 and less than or equal to 30.

With reference to those shown in FIG. 1, since the functional group 11b having a carbon-carbon double bond is located at the end with respect to the main chain part 11a of the organic ligand and is easily subjected to reaction; and since $X_1$ group, $X_2$ group, and $X_3$ group are all relatively simple carbon chain structures, and the reactivities thereof are less than those of the unsaturated carbon-carbon double bonds attached, in this way, the carbon-carbon double bond which is located at the end of the chain structure and is attached to $X_1$ group, $X_2$ group, and $X_3$ group may be subjected to a crosslinking reaction with a monomer or a prepolymer in a photosensitive resin under an exposure condition. This allows the luminescent particles 10, such as quantum dots having a core-shell type structure described above, to be uniformly incorporated into the polymer system of the photosensitive resin.

On this basis, with respect to the above luminescent complex 01 provided in an embodiment of this disclosure, since the luminescent particle 10 binds to the organic ligand 11, in the structural formula of the organic ligand 11, the carbon-carbon double bond which is attached to the $X_1$ group, the $X_2$ group and the $X_3$ group may be subjected to a crosslinking reaction with a photosensitive resin which is the main material of a color filter under an exposure condition, this allows luminescent particles 10 to be uniformly incorporated into the polymer system of the photosensitive resin, the effect of uniform dispersion, to which physical dispersion such as stirring, etc., is incomparable, can be achieved by luminescent particles 10 in the photosensitive resin. The occurrence of re-agglomeration of luminescent particles is also prevented in subsequent processing steps such as the second heating, etc., or in the process of use. Therefore, the dispersibility of luminescent particles 10, such as quantum dots, etc., in the main material of a color filter is increased to ameliorate problems, such as uneven light emission, low light emission efficiency, etc., of a substrate for display composed of luminescent particles 10 due to the presence of agglomeration of luminescent particles, so as to further reduce the loss of the back light brightness caused by the color filter film.

When the above E, D, and G groups as connecting groups in the main chain part 11a of the organic ligand employ the above groups such as a hydrogen atom, a halogen atom, a hydroxyl group, —C=C—, etc., electron clouds of these groups may exert an electron-donating or electron-withdrawing function in the process of synthesizing the organic ligand 11 since they are relatively asymmetric, and it is favorable to the design and the synthesis of the organic ligand 11.

Here, in the structural formula of the organic ligand 11, the coefficients m, n, s, and p of the groups satisfy the following value ranges and relational expressions respectively:

m is an integer and 0≤m≤30; n is an integer and 0≤n≤30; s is an integer and 0≤s≤30; (m+n+s)≠0; and p is an integer and 1≤p·(m+n+s)≤30.

Here, the number of chain structures of the organic ligand 11 satisfying the value ranges and the relational expressions described above is moderate, and it is impossible that the synthesis is difficult or the reactivity is relatively poor after synthesis due to the large number of chain structures.

Figure 2:
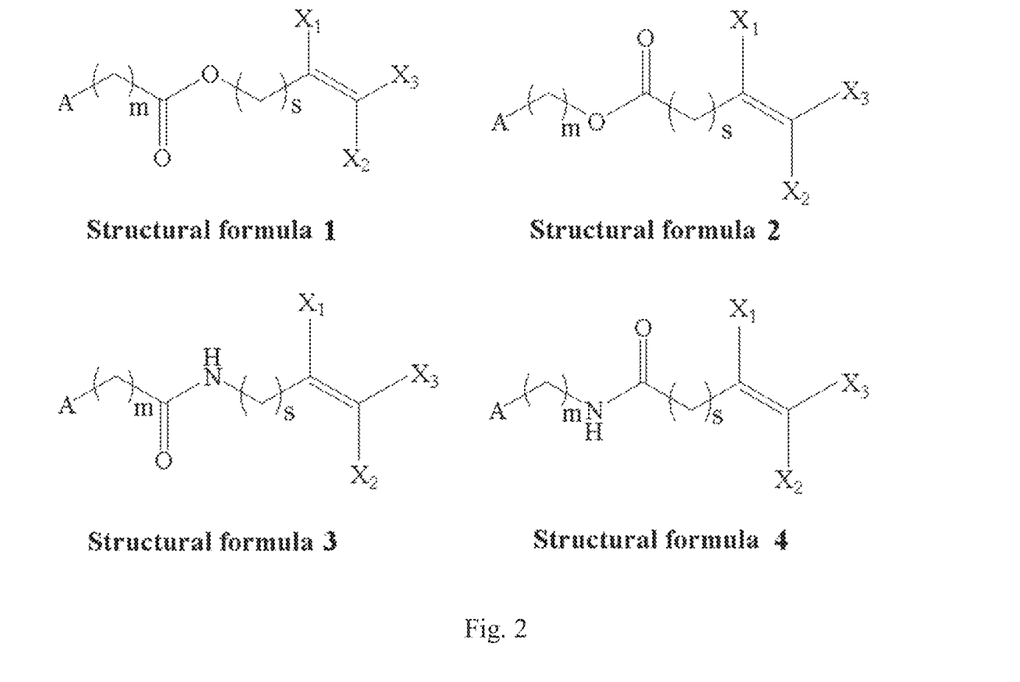
FIG. 2 is specific structural formulas 1-4 of an organic ligand in a luminescent complex provided in an embodiment of this disclosure.

Further, for convenience of design two groups, which are A group and the carbon-carbon double bond attached to $X_1$ group, $X_2$ group, and $X_3$ group, in the same molecule (i.e., the organic ligand 11 described above), the main chain part 11a of the organic ligand preferably have a carboxylic acid or an amide which is easily synthesized. That is, as shown in FIG. 2, the structural formula of the organic ligand 11 described above may specifically comprise at least one of the 4 structural formulas shown in the figure.

Here, in the structural formula of the organic ligand 11 described above, when E group=D group=a hydrogen atom, G group=—COO—; and n=p=1, the above specific structural formula 1 may be obtained.

In the structural formula of the organic ligand 11 described above, when E group=D group=a hydrogen atom, G group=—OOC—; and n=p=1, the above specific structural formula 2 may be obtained.

In the structural formula of the organic ligand 11 described above, when E group=D group=a hydrogen atom, G group=—CONH—; and n=p=1, the above specific structural formula 3 may be obtained.

In the structural formula of the organic ligand 11 described above, when E group=D group=a hydrogen atom, G group=—HNOC—; and n=p=1, the above specific structural formula 4 may be obtained.

Figure 3:
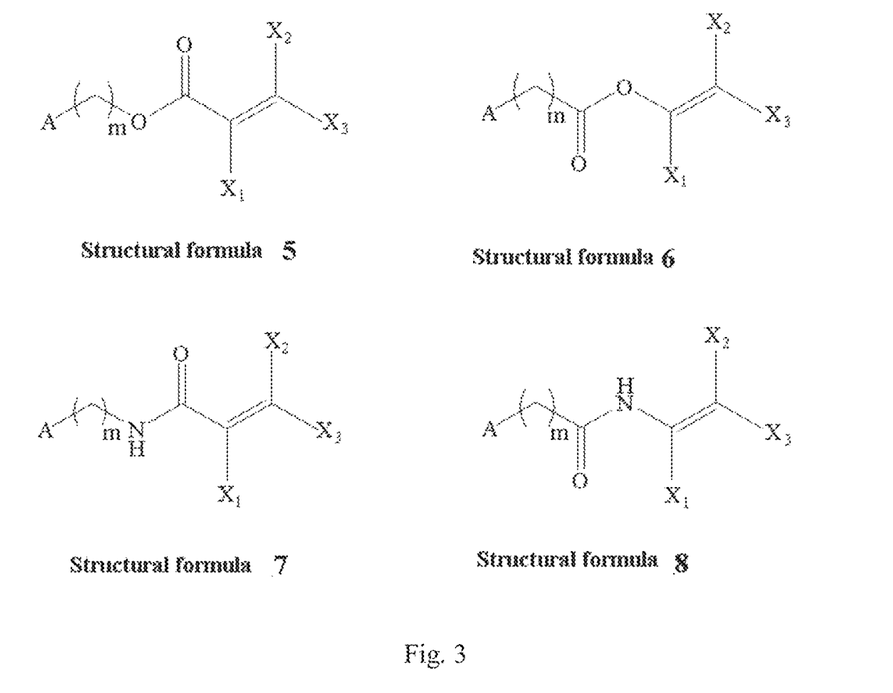
FIG. 3 is specific structural formulas 5-8 of an organic ligand in a luminescent complex provided in an embodiment of this disclosure.

Further, for convenience of design two groups, which are A group and the carbon-carbon double bond attached to $X_1$ group, $X_2$ group, and $X_3$ group, in the same molecule (i.e., the organic ligand 11 described above), the main chain part 11a of the organic ligand preferably have a carboxyl group or an amide beside the carbon-carbon double bond attached to $X_1$ group, $X_2$ group, and $X_3$ group. The reactivity of the carbon-carbon double bond of the product obtained is higher, and it is more favorable to the occurrence of the crosslinking reaction with a photosensitive resin under an exposure condition. That is, as shown in FIG. 3, the structural formula of the organic ligand 11 described above may specifically comprise at least one of the 4 structural formulas shown in the figure.

Here, in the structural formula of the organic ligand 11 described above, when E group=a hydrogen atom, G group=—OOC—; and n=1, s=0, the above specific structural formula 5 may be obtained.

In the structural formula of the organic ligand 11 described above, when E group=a hydrogen atom, G group=—COO—; and n=1, s=0, the above specific structural formula 6 may be obtained.

In the structural formula of the organic ligand 11 described above, when E group=a hydrogen atom, G group=—NHCO—; and n=1, s=0, the above specific structural formula 7 may be obtained.

In the structural formula of the organic ligand 11 described above, when E group=a hydrogen atom, G group=—CONH—; and n=1, s=0, the above specific structural formula 8 may be obtained.

Here, the organic ligand 11 having the specific structural formulas 1-8 described above may be first synthesized, and quantum dots are then synthesized; or otherwise, a post-functionalization method may be used to modify an organic compound having luminescent particles 10 to form the organic ligand 11 having the specific structural formulas 1-8 described above.

Exemplarily, a luminescent particle 10 having mercaptoacetic acid (molecular formula: $C_2H_4O_2S$) as a ligand may be first synthesized, and the organic ligand 11 having the specific structural formulas 1-8 described above is then synthesized by the reaction between a molecule containing a hydroxyl group or an amino group and the carboxylic acid on the luminescent particle 10. The synthesis reaction formulas described above may be as shown in FIG. 4 or FIG. 5.

Those to be indicated are as follows. Firstly, in FIG. 4 and FIG. 5 described above, the group coefficient s is an integer, and 0≤s≤30; and the above relational expressions between coefficients are also satisfied, i.e., $(m+n+s)\neq 0$, and $1\leq p\cdot(m+n+s)\leq 30$.

Figure 4:
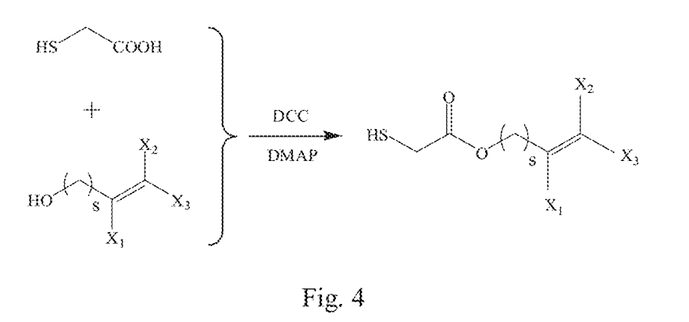
FIG. 4 is a first synthesis reaction scheme of an organic ligand in a luminescent complex provided in a specific embodiment of this disclosure.
Figure 5:
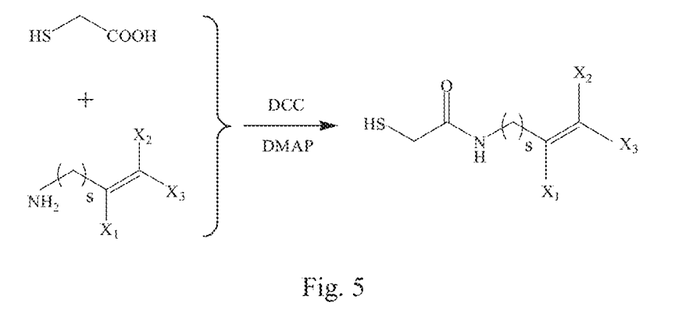
FIG. 5 is a second synthesis reaction scheme of an organic ligand in a luminescent complex provided in a specific embodiment of this disclosure.

Secondly, in the synthesis reaction formula described above, DCC (dicyclohexylcarbodiimide, molecular formula: $C_{13}H_{22}N_2$) as a dehydration agent allows the synthesis reaction equilibrium to shift in the forward direction to increase the reaction yield; DMAP (4-dimethylaminopyridine, molecular formula: $C_7H_{10}N_2$) is an extremely strongly nucleophilic acylation catalyst, which may increase the yield of acylation reactions.

Thirdly, further in the specific structural formula 1 of the organic ligand 11 described above, when A group =HS— and m=1, the structural formula of the reaction product shown in FIG. 4 may be obtained; and further in the specific structural formula 3 of the organic ligand 11 described above, when A group =HS— and m=1, the structural formula of the reaction product shown in FIG. 5 may be obtained.

Four specific Examples are set forth below to describe the production method of the above luminescent complex 01 in detail.

Example 1

The luminescent complex 01 is composed of an organic ligand ① and a luminescent particle ①. Here, the organic ligand ① is 10-undecenoic acid (CAS No.: 112-38-9), and the structural formula thereof is shown below:

wherein in the structural formula of the organic ligand 11 described above:
when $X_1$ group =$X_2$ group =$X_3$ group=a hydrogen atom, A group =HOOC—, G group=—CH$_2$—; coefficients m=s=0, p=1, n=8, the structural formula of the organic ligand ① described above may be obtained; moreover, the specific synthesis process of the organic ligand ① may follow the prior art, and verbose words are omitted herein.

The luminescent particle ① is a quantum dot having a CdSe@CdS core-shell type structure.

2. Preparation of a Precursor Solution of Luminescent Particle ①
Preparation of a Sulfur Precursor Solution:

0.033 g of sulfur powder was weighed, 10 mL of liquid paraffin was measured, the two raw materials described above were added to a first three-necked flask, and were heated to 120° C. with continuous stirring until completely dissolved, to form a yellowish clear solution, which was a sulfur precursor solution.

Preparation of a Selenium Precursor Solution:

0.078 g of selenium powder was weighed, 50 mL of liquid paraffin was measured, the two raw materials described above were added to a second three-necked flask, and were heated to 220° C. with continuous stirring until completely dissolved, to form a burgundy clear solution, which was a selenium precursor solution.

Preparation of a Cadmium Precursor Solution:

1.28 g of cadmium oxide was weighed, 40 mL of liquid paraffin and 9.8 mL of an organic ligand ① (i.e., 10-undecenoic acid) were measured, the three raw materials described above were added to a third three-necked flask, and were heated to 180° C. with continuous stirring to allow cadmium oxide to be completely dissolved, so as to form a brownish red clear solution, which was a cadmium precursor solution.

3. Preparation of Organic Ligand ①+Luminescent Particle ①:

S11: 5 mL of the cadmium precursor solution was withdrawn and injected to the selenium precursor solution, the temperature of the solution would decrease to about 210° C. at this point, the sulfur precursor solution was injected after the temperature of the solution rose back to 220° C. and reaction was performed for 1 minute, and heating was stopped and the reaction product was left to room temperature after reaction was performed for 40 minutes.

S12: A certain amount of anhydrous methanol was added to the reaction product described above to promote precipitation of the product and noticeable turbidity was generated in the solution. The supernatant in the solution was removed by centrifugal separation, cyclohexane or toluene was further added to disperse the product, and the product was then centrifuged. The above procedures were repeated for three times or more to remove most of organic reactants in the product by washing, and the luminescent complex 01 described above was thus obtained.

Here, in order to detect the wavelength of the light emitted from the luminescent particle ① after being excited by light irradiation, the reaction product obtained in the step S12 described above was dispersed into toluene, and it was indicated by a fluorescence spectrum test that the reaction product has a fluorescence emission peak at approximately 540 nm (i.e., photoluminescent green light) and a full width at half maximum of about 37 nm.

Example 2

The luminescent complex 01 is composed of an organic ligand ② and a luminescent particle ②. Here, the structural formula of the organic ligand ② is shown below:

wherein further in the specific structural formula 4 of the organic ligand 11 described above, when $X_1$ group=—$CH_3$, $X_2$ group =$X_3$ group=a hydrogen atom, A group=—$NH_2$; and coefficients s=0, m=3, the structural formula of the organic ligand ② described above may be obtained.

Figure 6:
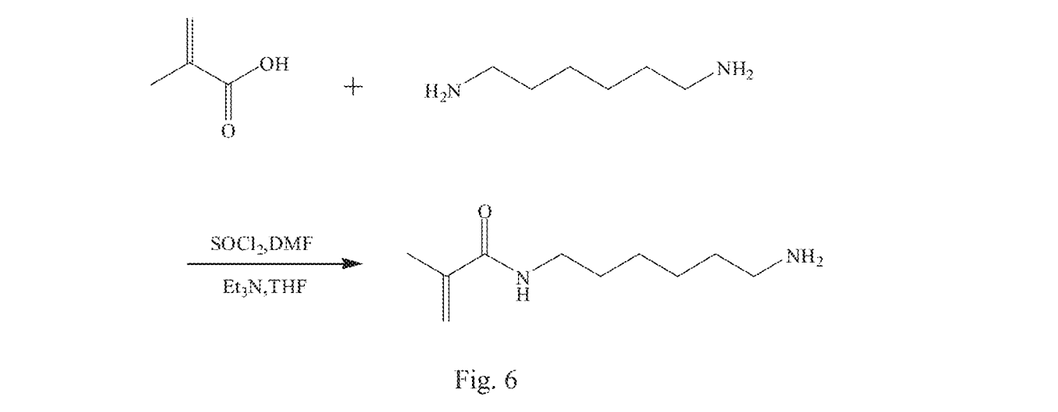
FIG. 6 is a synthesis reaction scheme for synthesizing an organic ligand ② provided in Example 2 of this disclosure.

The raw materials for the synthesis reaction of organic ligand ② are hexamethylenediamine (CAS No.: 124-09-4, molecular formula: $NH_2(CH_2)_6NH_2$) and methacrylic acid (CAS No.: 79-41-4, molecular formula: $C_4H_6O_2$). The reaction formula is as shown in FIG. 6, and the specific process is as follows.

8.6 g of methacrylic acid, 100 mL of toluene, and 13.1 g of $SOCl_2$ were added to a three-necked flask, an appropriate amount of DMF was added, heating reflux was performed for 2 h, and toluene was recovered at a reduced pressure and the solution was cooled. 100 mL of THF was added to the residual liquid, and continuous stirring was performed for dissolution. 11.1 g of $Et_3N$ and 12.8 g of hexamethylenediamine were added, subjected to heating reflux for 1.5 h, and cooled. Triethylamine hydrochloride was removed by filtration, and the filtrate was distilled at a reduced pressure to remove residual THF in the filtrate to obtain a crude product of the organic ligand ②. The crude product was recrystallized with isopropanol/cyclohexane to obtain 13.8 g of the organic ligand ② with a yield of 75%.

Here, in the reaction formula described above, $SOCl_2$ is thionyl chloride, which was used as a chlorinating agent; DMF is dimethylformamide (molecular formula: $C_3H_7NO$) and may be used as a high-boiling polar (hydrophilic) aprotic solvent, which can promote the progress of SN2 reaction mechanism; $Et_3N$ is triethylamine (molecular formula: $C_6H_{15}N$), used as a catalyst of the reaction described above; and THF is tetrahydrofuran (molecular formula: $C_4H_8O$), used as an aprotic solvent with a medium polarity in the reaction described above.

By the tests of mass spectrometry and nuclear magnetic resonance performed on the organic ligand ② described above, the structural formula thereof may be determined as described above. Here, the data of mass spectrometry detection was: EI-MS m/z 184.2 (M)+; and the data of nuclear magnetic resonance detection was: $^1$H-NMR (400 MHz, CDCl3) δ8.26 (t, 1H), 5.99 (s, 1H), 5.58 (s, 1H), 3.02 (m, 2H), 2.13 (m, 2H), 2.72 (m, 2H), 2.01 (s, 3H), 1.22-1.68 (m, 8H).

The luminescent particle ② was a CdSe quantum dot.

2. Preparation of a Precursor Solution of Luminescent Particle ②

Preparation of a Cadmium Precursor Solution:

1.28 g of cadmium oxide was weighed, 17 mL of liquid paraffin and 8 mL oleic acid 2 were measured, the three raw materials described above were added to a conical flask, and were slowly heated to 150° C. with continuous stirring to allow cadmium oxide to be completely dissolved, so as to form a dark red clear solution, which was a cadmium precursor solution.

Preparation of a Selenium Precursor Solution:

0.08 g of selenium powder was weighed, 50 mL of liquid paraffin was measured, the two raw materials described above were added to a three-necked flask, and were slowly heated to 220° C. with continuous stirring, to form a bright yellow clear solution, which was a selenium precursor solution.

3. Preparation of Organic Ligand ②+Luminescent Particle ②:

S21: 5 mL of the cadmium precursor solution was withdrawn and rapidly injected to the selenium precursor solution, 2 mL of the organic ligand ② was added and rapidly stirred, and the solution rapidly turned to be orange. The reaction temperature of the solution was maintained at 220° C. to allow gradual growth of quantum dots. After the reaction was continued for 5 min, the solution was added to

50 mL of cold toluene to prevent the growth of quantum dots (preventing the agglomeration phenomenon of quantum dots).

S22: A certain amount of anhydrous methanol was added to the reaction product described above to promote precipitation of the product and noticeable turbidity was generated in the solution. The supernatant in the solution was removed by centrifugal separation, cyclohexane or toluene was further added to disperse the product, and the product was then centrifuged. The above procedures were repeated for three times or more to remove most of organic reactants in the product by washing, and the luminescent complex 01 described above was thus obtained.

Here, in order to detect the wavelength of the light emitted from the luminescent particle ② after being excited by light irradiation, the reaction product obtained in the step S22 described above may be dispersed into toluene, and it is indicated by a fluorescence spectrum test that the reaction product has a fluorescence emission peak at approximately 525 nm (i.e., photoluminescent green light) and a full width at half maximum of about 32 nm.

Example 3

The luminescent complex 01 is composed of an organic ligand ③ and a luminescent particle ③. Here, the structural formula of the organic ligand ③ is shown below:

wherein further in the specific structural formula 1 of the organic ligand 11 described above, when $X_1$ group $=X_2$ group $=X_3$ group=a hydrogen atom; A group =COOH—; and coefficients s=2, m=10, the structural formula of the organic ligand ③ described above may be obtained.

Figure 7:
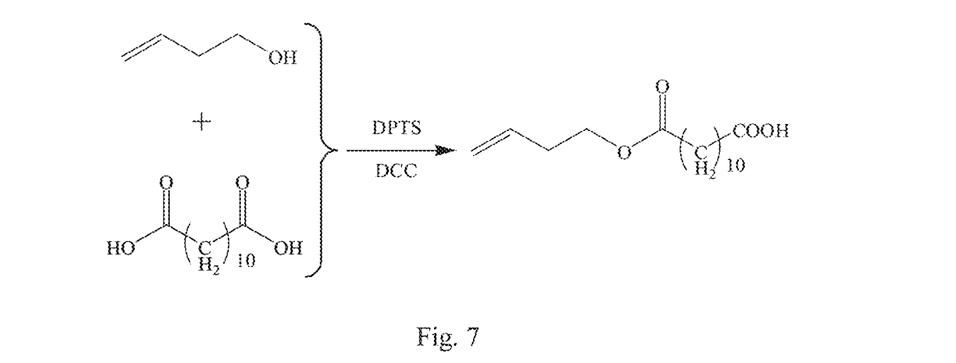
FIG. 7 is a synthesis reaction scheme for synthesizing an organic ligand ③ provided in Example 3 of this disclosure.

The raw materials for the synthesis reaction of organic ligand ③ are 3-butene-1-ol (CAS No.: 627-27-0, molecular formula: $C_4H_8O$) and 1,10-decanedioic acid (CAS No.: 693-23-2, molecular formula: $C_{12}H_{22}O_4$). The reaction formula is as shown in FIG. 7, and the specific process is as follows.

10 g of 3-butene-1-ol was dissolved in 50 mL of anhydrous dichloromethane, and 0.46 g of DPTS and 0.95 g of DCC were added. 23.0 g of 1,10-decanedioic acid was then dissolved in 100 mL anhydrous dichloromethane and was dropped into the above solution containing 3-butene-1-ol in a nitrogen atmosphere. The reaction was performed with stirring for 48 h under a room temperature condition, precipitate was removed by filtration, and the solvent was removed from the filtrate in a manner of rotary evaporation to obtain a crude product of the organic ligand ③. The crude product was recrystallized with petroleum ether and acetone to obtain 19.3 g of organic ligand ③ with a yield of 68%.

Here, in the reaction formula described above, DPTS is pyridinium p-toluenesulfonate (molecular formula: $C_7H_8O_3S$—$C_5H_5N$); DCC is dicyclohexylcarbodiimide (molecular formula: $C_{13}H_{22}N_2$) and used as a dehydration agent to allow the synthesis reaction equilibrium to shift in the forward direction and increase the reaction yield.

By the tests of mass spectrometry and nuclear magnetic resonance performed on the organic ligand ③ described above, the structural formula thereof may be determined as described above. Here, the data of mass spectrometry detection was: EI-MS m/z 284.23 (M)+; and the data of nuclear magnetic resonance detection was: $^1$H-NMR (400 MHz, CDCl3) δ12.13 (S, 1H), 5.73 (m, 1H), 4.97-5.15 (m, 2H), 4.32 (t, 2H), 2.23-2.36 (m, 6H), 1.56-1.68 (m, 4H), 1.22-1.29 (m, 12H).

2. Preparation of a Precursor Solution of Luminescent Particle ③
Preparation of a Sulfur Precursor Solution:

0.033 g of sulfur powder was weighed, 10 mL of liquid paraffin was measured, the two raw materials described above were added to a first three-necked flask, and were slowly heated to 120° C. with continuous stirring until completely dissolved, to form a yellowish clear solution, which was a sulfur precursor solution.

Preparation of a Selenium Precursor Solution:

0.078 g of selenium powder was weighed, 50 mL of liquid paraffin was measured, the two raw materials described above were added to a second three-necked flask, and were slowly heated to 220° C. with continuous stirring until completely dissolved, to form a burgundy clear solution, which was a selenium precursor solution.

Preparation of a Cadmium Precursor Solution:

1.28 g of cadmium oxide was weighed, 40 mL of liquid paraffin and 9.8 mL of an organic ligand ③ were measured, the three raw materials described above were added to a third three-necked flask, and were heated to 180° C. with continuous stirring to allow cadmium oxide to be completely dissolved, so as to form a brownish red clear solution, which was a cadmium precursor solution.

3. Preparation of Organic Ligand ③+Luminescent Particle ③:

S31: 5 mL of the cadmium precursor solution was withdrawn and injected to the selenium precursor solution, the temperature would decrease to about 210° C. at this point, the sulfur precursor solution was injected after the temperature rose back to 220° C. and reaction was performed for 1 minute, and heating was stopped and the reaction product was left to room temperature after reaction was performed for 40 minutes.

S32: A certain amount of anhydrous methanol was added to the reaction product described above to promote precipitation of the product and noticeable turbidity was generated in the solution. The supernatant in the solution was removed by centrifugal separation, cyclohexane or toluene was further added to disperse the product, and the product was then centrifuged. The above procedures were repeated for three times or more to remove most of organic reactants in the product by washing, and the luminescent complex 01 described above was thus obtained.

Here, in order to detect the wavelength of the light emitted from the luminescent particle ③ after being excited by light irradiation, the reaction product obtained in the step S32 described above may be dispersed into toluene, and it is indicated by a fluorescence spectrum test that the fluorescence emission peak was at approximately 540 nm (i.e., photoluminescent green light) and the full width at half maximum was about 37 nm.

The modes of preparation used in Examples 1-3 described above are all firstly synthesizing the organic ligand 11 having a certain structural formula described above and then synthesizing a quantum dot to form the luminescent complex 01 described above. The Example 4 is provided below to describe a preparation process in detail, where in a post-functionalization method is used to modify an organic compound having luminescent particles 10 to form the luminescent complex 01 described above.

Example 4

The luminescent complex 01 is composed of an organic ligand ④ and a luminescent particle ④. Here, the structural formula of the organic ligand ④ is shown below:

wherein further in the specific structural formula 3 of the organic ligand 11 described above, when $X_1$ group $=CH_3—$, $X_2$ group $=X_3$ group$=$a hydrogen atom, A group $=HS—$; and coefficients $s=m=1$, the structural formula of the organic ligand 0 described above may be obtained.

The luminescent particle ④ employs the same material with luminescent particle Ī, which is a quantum dot having a CdSe@CdS core-shell type structure.

2. Preparation of Quantum Dots Having CdSe@CdS Core-Shell Structure with Oleic Acid as a Ligand 2.1. Preparation of a Precursor Solution for CdSe@CdS Preparation of a Sulfur Precursor Solution:

0.033 g of sulfur powder was weighed, 10 mL of liquid paraffin was measured, the two raw materials described above were added to a first three-necked flask, and were slowly heated to 120° C. with continuous stirring until completely dissolved, to form a yellowish clear solution, which was a sulfur precursor solution.

Preparation of a Selenium Precursor Solution:

0.078 g of selenium powder was weighed, 50 mL of liquid paraffin was measured, the two raw materials described above were added to a second three-necked flask, and were slowly heated to 220° C. with continuous stirring until completely dissolved, to form a burgundy clear solution, which was a selenium precursor solution.

Preparation of a Cadmium Precursor Solution:

1.28 g of cadmium oxide was weighed, 40 mL of liquid paraffin and 10 mL of oleic acid were measured, the three raw materials described above were added to a third three-necked flask, and were heated to 180° C. with continuous stirring to allow cadmium oxide to be completely dissolved, so as to form a brownish red clear solution, which was a cadmium precursor solution.

2.2. Preparation of Oleic Acid+CdSe@CdS

S41: 5 mL of the cadmium precursor solution was withdrawn and injected to the selenium precursor solution, the temperature would decrease to about 210° C. at this point, the sulfur precursor solution was injected after the temperature rose back to 220° C. and reaction was performed for 1 minute, and heating was stopped and the reaction product was left to room temperature after reaction was performed for 40 minutes.

S42: A certain amount of anhydrous methanol was added to the reaction product described above to promote precipitation of the product and noticeable turbidity was generated in the solution. The supernatant in the solution was removed by centrifugal separation, and cyclohexane or toluene was further added to disperse the product. The above procedures were repeated for three times or more to remove most of organic reactants in the product by washing, and the luminescent complex 01 described above was thus obtained.

Here, in order to detect the wavelength of the light emitted from the luminescent particle ④ after being excited by light irradiation, the reaction product obtained in the step S42 described above may be dispersed into toluene, and it is indicated by a fluorescence spectrum test that the fluorescence emission peak was at approximately 540 nm (i.e., photoluminescent green light) and the full width at half maximum was about 37 nm.

3. Ligand Exchange Reaction Between Mercaptoacetic Acid and Oleic Acid:

S51: 20 g of the centrifugally purified product obtained in step S42 described above was weighed and dispersed in THF (i.e., tetrahydrofuran) and 15 mL of an aqueous solution of mercaptoacetic acid with a concentration of 3 mol/L was dropped under the action of ultrasonic oscillation, and the process of dropping described above was completed in 5 min.

Figure 8:
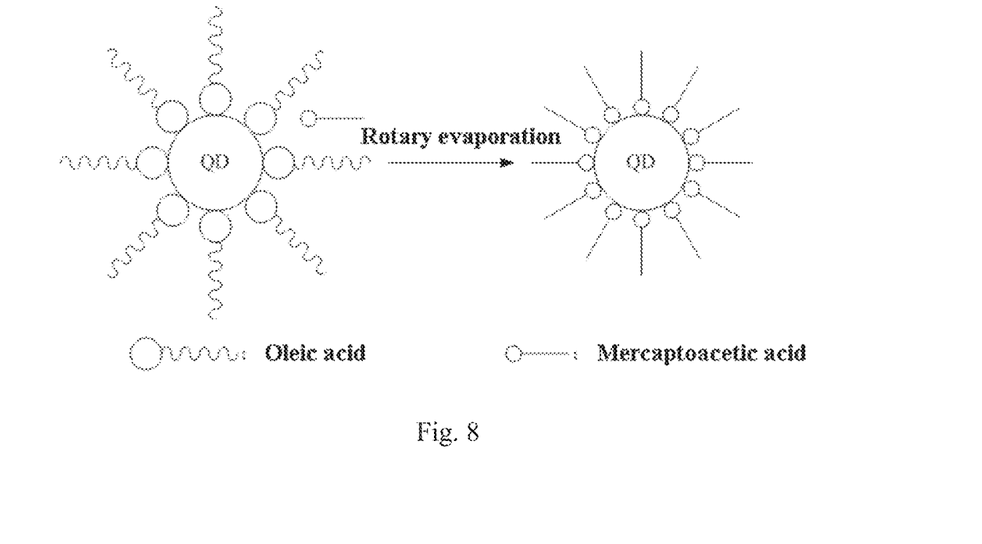
FIG. 8 is a schematic diagram of a ligand exchange process provided in Example 4 of this disclosure.

S52: ligand exchange reaction was performed with a rotary evaporator under a room temperature condition, wherein the reaction principle was as shown in FIG. 8 and the rotation speed is 8000 r/min, and a CdSe@CdS quantum dot with mercaptoacetic acid as a ligand was thereby obtained. In order to prevent the agglomeration phenomenon of quantum dots generated before the subsequent reaction process, the reaction product described above was dispersed in THF.

Here, the use of rotary evaporation can ensure the absence of oxygen in the reaction system so as to prevent oxidation on the surface of the quantum dot. Furthermore, the sample in the process of rotary evaporation was protected from light to prevent photodegradation of the luminescent core CdSe.

4. Post-Functionalization Modification Reaction of Mercaptoacetic Acid+CdSe@CdS:

S61: The quantum dot with mercaptoacetic acid as the ligand of the step S52 described above was formulated into a solution with a concentration of 0.5 wt % under the action of ultrasonic oscillation.

Figure 9:
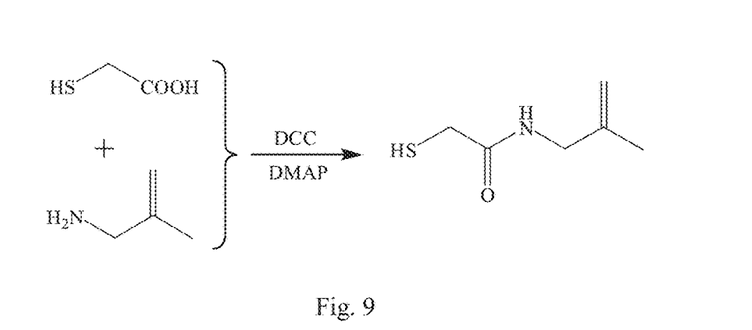
FIG. 9 is a synthesis reaction scheme for synthesizing an organic ligand ④ provided in Example 4 of this disclosure.

S62: 5 g of the solution described above, 100 mg of DCC, and 10 mg of DMAP were weighed, the three raw materials described above were added to a conical flask and uniformly stirred. 0.46 g (i.e., 6.5 mmol) of weighed 2-methylallylamine (CAS No.: 2878-14-0) was dropped into 5 g of the aforementioned solution, reaction was performed with stirring for 2 h, and insolubles were removed by filtration after the reaction was finished. Methanol was added to the solution described above, and a centrifugal separation process was performed under a centrifugal condition of 8000 r/min so as to obtain a quantum dot having an organic ligand a Here, the reaction between the ligand mercaptoacetic acid and 2-methylallylamine was as shown in FIG. 9.

On the basis described above, as shown in FIG. 10, an embodiment of this disclosure further provides a luminescent material, which comprises a photosensitive resin; and the above luminescent complex 01 dispersed in the photosensitive resin; wherein the photosensitive resin may be subjected to a crosslinking reaction with the carbon-carbon double bond which is attached to $X_1$ group, $X_2$ group, and $X_3$ group in the structural formula of the organic ligand 11 in the luminescent complex 01 under an exposure condition.

Figure 10:
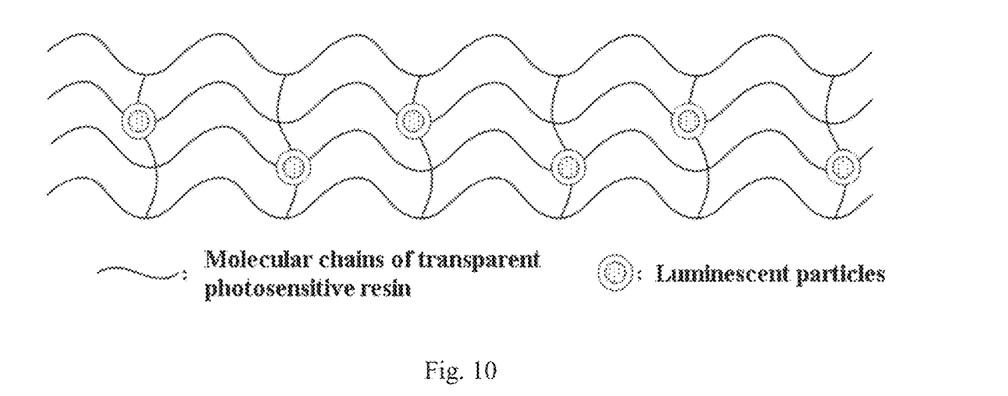
FIG. 10 is a structural schematic diagram of a luminescent material provided in an embodiment of this disclosure.

Those to be indicated are as follows. Firstly, the photosensitive resin described above refers to a photosensitive resin which may be subjected to a crosslinking reaction with an unsaturated bond under an exposure condition (typically ultraviolet exposure, abbreviated as UV).

Figure 11:
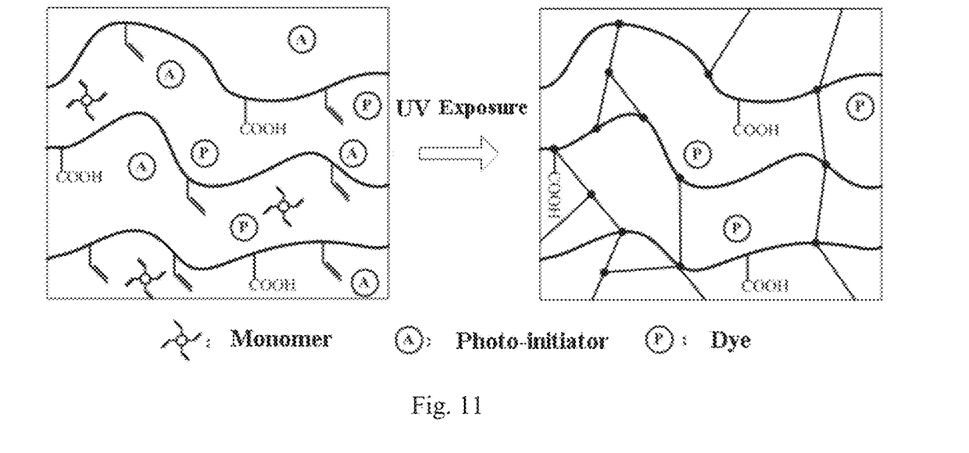
FIG. 11 is the reaction principle of a negative photoresist in the process of exposure.

Particularly, the photosensitive resin described above may be composed of a negative photoresist material, and the principle of development by exposure is as shown in FIG. 11. It is insoluble in alkali developer after UV exposure because its double bonds in the molecule are opened and crosslinking occurs between chains in the process of exposure to form a net-like structure insoluble in alkali so as to exert the function of etching resistance.

The specific composition of the negative photoresist material may be composed of a monomer or prepolymer such as acrylic acid, a solvent for increasing coating uniformity and ensuring line width uniformity after exposure, a photo-initiator for initiating photochemical reaction under UV irradiation, a pigment for promoting photochemical reaction, a speed enhancer for increasing exposure sensitivity, and a surfactant for preventing the occurrence radial ripples after exposure and development and improving coating properties, etc. Specific components may follow the prior art, and are not specifically defined in the embodiments of this disclosure.

Secondly, the mass proportion of the luminescent complex 01 incorporated into the photosensitive resin is less than or equal to 50%. Here, when the proportion of luminescent complex 01 incorporated is excessively large, the effect of the crosslinking reaction with the negative photoresist is not greatly improved, and the viscosity of the luminescent material may also be reduced and the coating of the color filter is impacted. Additionally, when the incorporated proportion is excessively small, it results in insufficient luminescent intensity of the color filter formed. Therefore, it is further preferred in the embodiment of this disclosure that the aforementioned mass proportion is 3-20%.

Here, the specific preparation process of the luminescent complex 01 incorporated into the photosensitive resin can be seen the aforementioned Examples 1-4, and verbose words are omitted herein.

Figure 12:
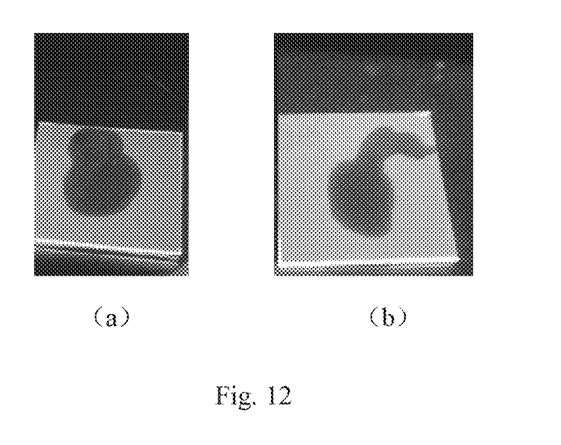
FIG. 12 is a comparative graph of light emission test results between a luminescent material provided in an embodiment of this disclosure and a red color filter provided in the prior art.

Exemplarily, as shown in FIG. 12, part (a) is a graph of the test for luminescent effect of a red color filter provided in the prior art; wherein those incorporated into the photosensitive resin are quantum dots binding normal organic ligands, which are not subjected to crosslinking reaction described above with the photosensitive resin; and part (b) is the above luminescent material provided in the embodiments of this disclosure, which is a graph of the test for luminescent effect of a luminescent particle 10 binding the new organic ligand 11 described above. It can be seen that in the same case of photoluminescent red light, the luminescent intensity using the luminescent material provided in the embodiments of this disclosure is significantly higher than that of the red color filter provided in the prior art. It is demonstrated that since the new organic ligand 11 may be subjected to a crosslinking reaction with the photosensitive resin as the main material of the color filter under an exposure condition, the luminescent particles 10 are allowed to be uniformly incorporated into the photosensitive resin, so as to ameliorate problems, such as uneven light emission, low light emission efficiency, etc., of the color filter film composed of luminescent particles 10 due to the presence of agglomeration of luminescent particles, i.e., exhibiting a higher luminescent intensity.

On the basis described above, as shown in FIG. 13, an embodiment of this disclosure further provides a substrate for display 02, and this substrate for display 02 comprises a base substrate 20; color filter units 21 of various colors located on the base substrate 20 in an array arrangement; wherein at least a color filter unit 21 of one color is composed of the above luminescent material cured by exposure; in the color filter unit 21 of one color composed of the luminescent material cured by exposure, the luminescent particles 10 in the luminescent material generate red light, green light, or blue light after being excited by light irradiation.

Figure 13:
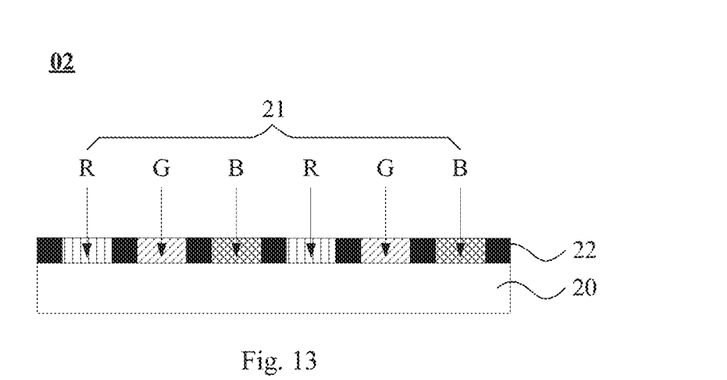
FIG. 13 is a structural schematic diagram of the section of a color filter substrate provided in an embodiment of this disclosure along the direction vertical to the surface of the substrate.

It is to be indicated that the substrate for display 02 described above may be specifically a color filter substrate. Of course, this color filter substrate may further comprise structures such as a black matrix 22, a protective layer, etc., which may specifically follow the prior art and are not defined in the embodiments of this disclosure.

Otherwise, the substrate for display 02 described above may also be provided as an array substrate (i.e., a COA (color filter on array) substrate integrated with the functions of a color filter film and an array) of a color filter unit; and in this case, structures such as a TFT (thin film transistor) array layer, an insulating layer, etc., may be further comprised between the color filter unit 21 and the base substrate 20. Of course, this COA substrate may further comprise structures such as a pixel electrode, a common electrode, etc., which may specifically follow the prior art and are not defined in the embodiments of this disclosure.

Since the substrate for display 02 typically comprises a red color filter, a green color filter, and a blue color filter, it is possible that color filters of only one color are composed of the luminescent material described above and the color filters of other colors are composed by following color filter materials in the prior art. Of course, color filters of respective colors in the substrate for display 02 described above may also be composed of the luminescent material described above, i.e., color filters of respective colors illustrated as "R", "G", and "B" in the figure.

Further, an embodiment of this disclosure further provides a production method of the substrate for display 02 described above, which comprises the steps of:

S01: coating a luminescent material on a base substrate 20; and

S02: sequentially performing first heating, exposure, development, and second heating on the luminescent material to form at least a color filter unit 21 of one color.

Here, exemplarily, in the step S01 described above, a spin coating process may be used, the speed of spin coating may be 150-500 rpm, and a film layer having a thickness of 3 μm-20 μm is formed by spin coating for 10 s.

Since the luminescent material is composed of a photosensitive resin and a luminescent complex 01 dispersed therein, in the step S02 described above, the first heating is "pre-baking" typically called by the person skilled in the art, and its function is removing the solvent in the photosensitive resin, wherein the temperature of drying may be 60-100° C. and drying is performed for 60-120 s. The exposure process may employ the i-line wavelength (365 nm) and the exposure parameter is 60-200 mj/cm$^2$. The development process may employ a KOH (potassium hydroxide) solution or a TMAH (tetramethylammonium hydroxide) solution. The second heating is "post-baking" typically called by the person skilled in the art, and its function is further removing the residual solvent in the photosensitive resin for further crosslinking reaction so as to allow adhesive films to be more compact and harder and increase the adhesion with the base substrate 20, wherein the temperature of drying may be 100-200° C.

Further, an embodiment of this disclosure further provides a display apparatus, which comprises the substrate for display 02 described above.

As one optional manner, when the display apparatus described above is specifically a liquid crystal display apparatus, this display apparatus further comprises a back light module; and the back light module provides light irradiation to a display panel.

At least one color filter unit in the substrate for display 02 described above is composed of the luminescent material provided in the aforementioned embodiments, and the luminescent complex 01 in the luminescent material has photoluminescent properties, for example, luminescent particles 10 composed of quantum dots. Therefore, the light irradiation emitted from the back light module provides photon energy for light emission of the luminescent complex 01 described above.

Here, considering that when the light emitted from the back light module is white light, since the light directly emitted from a light source such as LED (light emitting diode), etc., is not white light (typically blue light), non-white light is further required to be converted to white light only by passing through fluorescent powder and the light emission efficiency of the light source is thus reduced.

Therefore, further, the light irradiation provided by the back light module described above preferably uses blue light, which allows that the luminescent particle 10 in the luminescent complex 01 may emit red light or green light under the excitation of blue light; whereas the blue color filter portion may follow a color filter incorporated with normal blue dye molecules.

Here, when the substrate for display 02 described above is specifically a color filter substrate, this display apparatus may specifically further comprise an array substrate cell-assembled with the color filter substrate described above, and a liquid crystal layer located therebetween, which may specifically follow the prior art, and verbose words are omitted herein.

The display apparatus described above may be specifically a product or member with any display function, such as a liquid crystal display, a liquid crystal television, a digital photo frame, a cell phone, a tablet computer, etc.

As another optional manner, when the display apparatus described above is specifically an organic electroluminescent display apparatus, the substrate for display 02 described above is specifically a color filter substrate, and this display apparatus further comprises an organic luminescent display panel (OLED panel) cell-assembled with a color filter substrate; wherein this OLED panel provides white light or blue light for the color filter substrate described above.

That is, the emitting layers (simply referred to as EL) in respective pixel units in the OLED panel emit white light or blue light.

It is to be indicated that all figures in this disclosure are brief schematic diagrams of the luminescent complex, the luminescent material, the color filter substrate described above. Only structures related to the inventive point are embodied for the purpose of clear description of this solution, and other structures which are not related to the inventive point are the existing structures and are not embodied or are partly embodied in the figures.

The above embodiments are only specific embodiments of the disclosure, but the scope of the disclosure is not limited thereto. Within the technical scope disclosed by this disclosure, any person skilled in the art will easily conceive variations or replacements, which should be covered by the scope of the disclosure. Therefore, the protection scope of the disclosure should be determined by the scope of the claims.

What is claimed is:

1. A luminescent material, comprising:
   a photosensitive resin composed of a negative photoresist material having a double bond in a molecule thereof; and
   a luminescent complex, comprising:
      a luminescent particle;
      an organic ligand located on the surface of the luminescent particle;

the organic ligand has a structural formula of wherein group A is a binding group which binds to the luminescent particle;

$X_1$ group, $X_2$ group, and $X_3$ group each independently represent a hydrogen atom, an aryl group having a carbon atom number of 6-30, a halogen atom, —$CH_3$, —$(CH_2)_a$—$CH_3$, —COOH, —$COOCH_3$, or —CH=$CH_2$, wherein a is an integer greater than or equal to 1;

E group represents a hydrogen atom, a halogen atom, a hydroxyl group, a carboxyl group, a mercapto group, an amino group, a formyl group, —$SO_2NH_2$, —$NHNH_2$, a saturated carbon chain having a carbon atom number of 1-30, or an unsaturated carbon chain having a carbon atom number of 1-10;

D group represents a hydrogen atom, a halogen atom, a hydroxyl group, a carboxyl group, a mercapto group, an amino group, a formyl group, —$SO_2NH_2$, —$NHNH_2$, a saturated carbon chain having a carbon atom number of 1-30, or an unsaturated carbon chain having a carbon atom number of 1-10;

G group represents —COO— or —CONH—;

wherein m is an integer and $0 \leq m \leq 30$; n is an integer and $0 < n \leq 30$; s is 0; and p is an integer and $1 \leq p \cdot (m+n+s) \leq 30$, and in the structural formula of the organic ligand, the carbon-carbon double bond which is attached to the $X_1$ group, the $X_2$ group and the $X_3$ group may be subjected to a crosslinking reaction with a photosensitive resin under an exposure condition;

wherein a mass proportion of the luminescent complex incorporated into the photosensitive resin is 3-20% based on the mass of the photosensitive resin.

2. The luminescent material according to claim 1, wherein the luminescent particle is a quantum dot.

3. The luminescent material according to claim 2, wherein:
   the quantum dot comprises at least one compound selected from CdS, CdSe, CdTe, ZnS, ZnSe, ZnTe, HgS, HgTe, GaN, GaAs, InP, and InAs; and
   the A group represents any one of NC—, HOOC—, HRN—, O=P(R)$_2$—, POOOH—, RS—, and RSS—, and the R group represents any one of a hydrogen atom, a saturated carbon chain having a carbon atom number of 1-10, and an unsaturated carbon chain having a carbon atom number of 1-10.

4. The luminescent material according to claim 3, wherein if the quantum dot comprises two or more of the compounds, the structure of the quantum dot is at least one of a core-shell type, a uniformly mixed type, and a gradiently mixed type.

5. The luminescent material according to claim 1, wherein the organic ligand has at least one structural formula of the group consisting of:

-continued

6. A substrate for display, which comprises a base substrate; and color filter units of various colors located on the base substrate in an array arrangement,
wherein at least a color filter unit of one color comprises a luminescent material cured by exposure, and the luminescent material is the luminescent material of claim 1, and
in the color filter unit of one color comprising the luminescent material cured by exposure, the luminescent particles in the luminescent material generate red light, green light, or blue light after being excited by light irradiation.

7. A display apparatus comprising the substrate for display as claimed in claim 6.

8. The display apparatus according to claim 7, wherein the display apparatus further comprises a back light module, wherein the back light module provides light irradiation to the substrate for display.

9. The display apparatus according to claim 8, wherein the light irradiation is blue light irradiation.

10. The display apparatus according to claim 7, wherein the substrate for display is a color filter substrate; and
the display apparatus further comprises an organic electroluminescent display panel corresponding to the color filter substrate;
wherein the organic electroluminescent display panel provides white light or blue light for the color filter substrate.

11. A production method of the substrate for display as claimed in claim 6, comprising the steps of:
coating a luminescent material on a base substrate; and
sequentially performing first heating, exposure, development, and second heating on the luminescent material to form at least a color filter unit of one color.

* * * * *